(12) United States Patent
Chung

(10) Patent No.: US 10,441,096 B2
(45) Date of Patent: Oct. 15, 2019

(54) MOUNTING DEVICE FOR ATTACHING A DISPLAY DEVICE, A PICTURE FRAME, OR THE LIKE TO A SUPPORTING STRUCTURE

(71) Applicant: Chul Chung, Seoul (KR)

(72) Inventor: Chul Chung, Seoul (KR)

( * ) Notice: Subject to any disclaimer, the term of this patent is extended or adjusted under 35 U.S.C. 154(b) by 0 days.

(21) Appl. No.: 15/913,754

(22) Filed: Mar. 6, 2018

(65) Prior Publication Data

US 2019/0274453 A1    Sep. 12, 2019

(51) Int. Cl.
| | |
|---|---|
| *A47G 1/17* | (2006.01) |
| *H01F 7/06* | (2006.01) |
| *A47G 1/16* | (2006.01) |
| *A47B 97/00* | (2006.01) |
| *H05K 5/00* | (2006.01) |

(52) U.S. Cl.
CPC .............. *A47G 1/17* (2013.01); *A47B 97/001* (2013.01); *A47G 1/166* (2013.01); *A47G 1/1613* (2013.01); *H01F 7/06* (2013.01); *H05K 5/0017* (2013.01)

(58) Field of Classification Search
CPC ........ A47G 1/17; A47G 1/1613; A47G 1/166; A47B 97/001; H01F 7/06; H05K 5/0017
USPC ........ 248/682, 467, 206.5; 40/711, 621, 655
See application file for complete search history.

(56) References Cited

U.S. PATENT DOCUMENTS

| | | | |
|---|---|---|---|
| 5,829,987 A | 11/1998 | Fritsch et al. | |
| 6,171,061 B1* | 1/2001 | Hsu .................. | F04D 25/088 416/244 R |
| 9,800,283 B2* | 10/2017 | Schmidt ............... | H04B 1/3877 |
| 9,847,805 B2* | 12/2017 | Sirichai ................. | A45C 11/00 |
| 10,173,292 B2* | 1/2019 | Fullerton ............. | B23P 15/001 |
| 2007/0044360 A1* | 3/2007 | Hillis ....................... | G09F 7/04 40/621 |
| 2009/0250576 A1* | 10/2009 | Fullerton ................. | G09F 3/00 248/206.5 |
| 2010/0083548 A1* | 4/2010 | Reis ..................... | A47G 1/0605 40/711 |
| 2012/0060399 A1* | 3/2012 | Sjodln .................... | G09F 3/208 40/655 |
| 2012/0305728 A1* | 12/2012 | Gravendeel ............ | A63B 27/00 248/309.4 |
| 2013/0160338 A1* | 6/2013 | Forbis ..................... | A47G 1/06 40/711 |

(Continued)

FOREIGN PATENT DOCUMENTS

KR    10-2014-0103808    8/2014

OTHER PUBLICATIONS

LG Global, "How to install LG Signature OLED TV W" Feb. 19, 2017, available at https://youtu.be/frR9EA89e4A?t=176.

*Primary Examiner* — Muhammad Ijaz
(74) *Attorney, Agent, or Firm* — H.C. Park & Associates, PLC

(57) ABSTRACT

A mounting device for attaching an object to a supporting structure includes a first member including at least one first magnet and a projection, the first member configured to be attached to a supporting structure, a second member including at least one second magnet and a recess to receive the projection, the at least one second magnet configured to be attracted to the at least one first magnet, and an electromagnet selectively operable to provide magnetic force to couple the first and second members together. A method of mounting an electronic display to a supporting structure also is disclosed.

16 Claims, 12 Drawing Sheets

(56) References Cited

U.S. PATENT DOCUMENTS

| | | | | |
|---|---|---|---|---|
| 2016/0040825 A1* | 2/2016 | Franklin | ................ | F16M 13/02 |
| | | | | 439/39 |
| 2016/0150861 A1* | 6/2016 | Yao | ........................ | A45C 11/00 |
| | | | | 224/245 |
| 2017/0354275 A1* | 12/2017 | Hatamian | ................ | A47G 1/17 |
| 2019/0045948 A1* | 2/2019 | Gale | ...................... | A47G 1/166 |

* cited by examiner

MOUNTING DEVICE FOR ATTACHING A DISPLAY DEVICE, A PICTURE FRAME, OR THE LIKE TO A SUPPORTING STRUCTURE

BACKGROUND

Field

Exemplary implementations of the invention relate generally to a mounting device, and more particularly, to a mounting device for mounting picture frames, televisions, monitors and/or display apparatuses to a wall using magnetic force.

Discussion of the Background

Generally, it is cumbersome and inconvenient to attach and re-attach objects to walls, such as picture frames, televisions, monitors, display apparatuses, and similar objects, in homes and professional settings. For example, picture frames are used in art exhibitions at an art museum or an art gallery. The layout of the picture frames on the walls of the museum or gallery changes frequently according to the artist's request or as the art exhibition changes.

Also, as electronic technology has developed, the thickness of a television sets and other display apparatus has become smaller and the weight of the display lighter, thereby leading many to mount displays onto walls of homes, business, etc. Moreover, with advancements in display technology the viewing size of television monitors and other display has greatly increased. Displays measuring five foot or more diagonally are now commonplace. Wall mount brackets with screws or hooks often are used to attach picture frames or the display apparatuses onto a wall. In a case when attaching a display apparatus a wall using a wall mount bracket, the display apparatus is generally spaced away from wall by, for example, as much as the thickness of the wall mount bracket. In addition, once the display apparatus is fixed using the wall mount bracket, it is hard to detach or adjust the display apparatus. In addition, mounting brackets with permanent magnets have been used as well. Moreover, as the viewing size of television monitors and other display has increased, the process of mounting large display onto a wall has become even more cumbersome and difficult.

The above information disclosed in this Background section is only for enhancement of understanding of the background of the inventive concepts and, therefore, it may contain information that does not constitute prior art.

SUMMARY

While many approaches have been tried, there still is a need for a more convenient, secure mounting system that is capable of securely and conveniently mounting expensive or fragile objects, such as artwork and electronic displays, while permitting ready and quick detachment and re-attachment.

Mounting devices constructed according to the principles and exemplary implementations of the invention provide a convenient, secure attachment system including a selectively operable electromagnet to provide a variable force for mounting objects, such as picture frames and/or display apparatuses, to a wall. Moreover, exemplary embodiments of mounting devices of the invention may variably control the magnetic forces and provide flexibility in attaching, detaching, moving, rotating or adjusting the picture frames and/or the display apparatuses, and may prevent accidental detachment of the picture frames and/or the display apparatuses by unintended impact such as earthquake.

According to one or more implementations of the invention, a mounting device for attaching an object to a supporting structure includes a first member including at least one first magnet and a projection, the first member configured to be attached to a supporting structure, a second member including at least one second magnet and a recess to receive the projection, the at least one second magnet configured to be attracted to the at least one first magnet, and an electromagnet selectively operable to provide magnetic force to couple the first and second members together.

The at least one first magnet may include a plurality of first magnets disposed alternately with opposite polarities, and the at least one second magnet may include a plurality of second magnets disposed alternately with opposite polarities to match to the corresponding at least one first magnet.

The electromagnet may be an electropermanent magnet.

The electromagnet may have a power supply operable to reduce the magnetic force produced by the electromagnet while power is supplied to the electromagnet.

The at least one first magnet may include a plurality of magnets arranged in at least one of a substantially circular layout, a substantially rectangular square layout, and a is substantially cross-shaped layout.

The projection and the recess may include part of a detent mechanism including a spring biasing the projection into the recess.

At least some of the first magnets and the second magnets may have a substantially fan-type shape.

The recess may include a groove having a depth less than about 1 mm.

The object may include one of an electronic display and a picture frame and the supporting structure may include at least part of a wall.

At least one of the first and second members may include a plate.

The second member may include a portion of an object to be attached to the supporting structure.

The object may include an electronic display and the electromagnet has a power supply separate from the electronic display.

According to one or more exemplary implementations of the invention, a mounting device includes a first member including magnets and a protrusion, the first member configured to be attached to a supporting structure, and a second member including a groove to receive the protrusion. At least one of the magnets is an electromagnet.

The electromagnet may be an electropermanent magnet.

The protrusion and the groove may include part of a detent mechanism including a spring biasing the protrusion into the groove.

The groove may have a depth less than about 1 mm.

At least one of the first and second members may include a plate.

The second member may include a portion of an object to be attached to the supporting structure.

The object may include an electronic display and the electromagnet has a power supply separate form the electronic display According to one or more exemplary implementation of the invention, a method of mounting an electronic display to a supporting structure includes the steps of attaching a first member to a supporting structure, attaching a second member configured to be attached to or formed as part of an electronic display to the first member using a first, substantially constant magnetic force, and attaching the second member to the first member using a second, electromagnetic force to increase the force holding the first and second members together.

The step of attaching the second member to the first member using a second, electromagnetic force to increase the force holding the first and second members together may include turning off power to an electromagnet coupled between the first and second members.

The method may further include the step of adjusting the relative position of the first and second members by reducing the second, electromagnetic force to decrease the force holding the first and second members together.

The step of adjusting the relative position of the first and second members by reducing the second, electromagnetic force to decrease the force holding the first and second members together may include turning on power to the electromagnet.

Additional aspects will be set forth in part in the description which follows and, in part, will be apparent from the disclosure, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
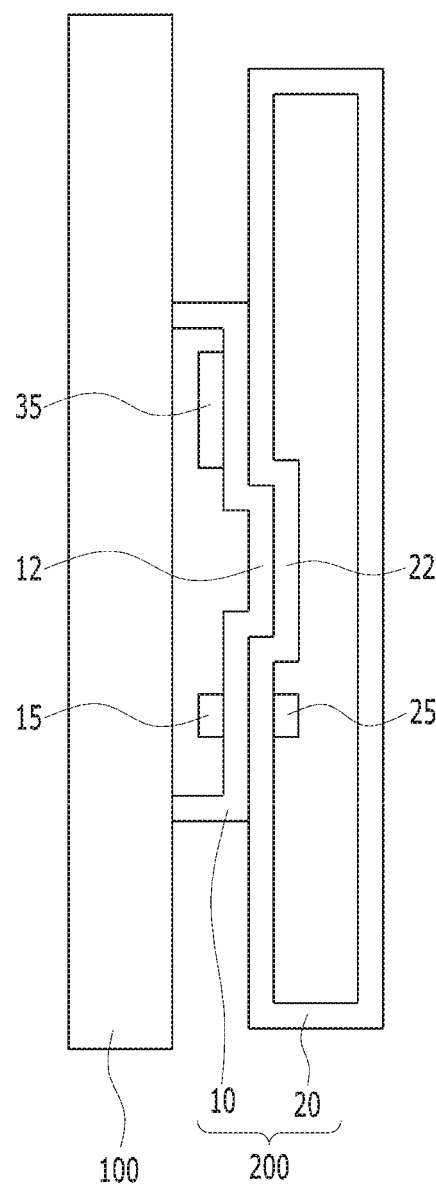
FIG. 1 is a schematic cross sectional view of a mounting device constructed according to an exemplary embodiment of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
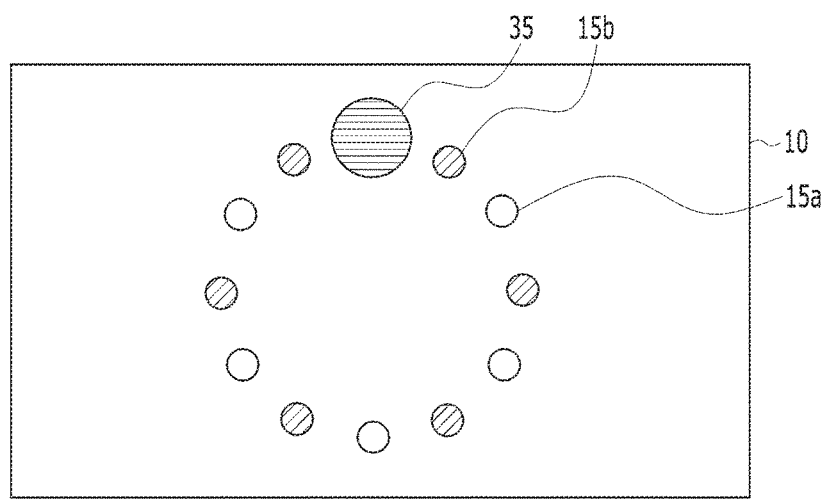
FIG. 2 is a schematic plan view of a first plate of the mounting device of FIG. 1.
Figure 3:
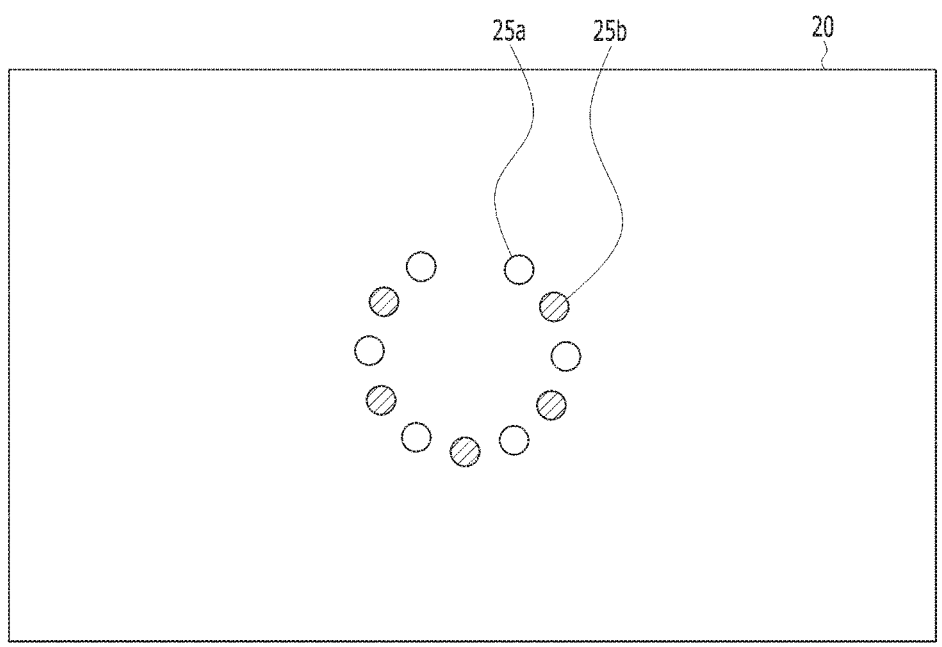
FIG. 3 is a schematic plan view of a second plate of the mounting device of FIG. 1.

FIG. 1 is a schematic cross sectional view of a mounting device constructed according to an exemplary embodiment of the invention. FIG. 2 is a schematic plan view of a is first plate of the mounting device of FIG. 1. FIG. 3 is a schematic plan view of a second plate of the mounting device of FIG. 1.

Referring to FIGS. 1 to 3, mounting device 200 includes support members such as a first plate 10 and second plate 20. First plate 10 is attached to supporting structure 100, which may be any type of structure capable of supporting an object, such as interior or exterior load or non-load bearing walls, and the like. First plate 10 may be attached to supporting structure 100 with fasteners, screws, glue, tapes, or other types of bonding tools or fastening members or agents known in the art. Second plate 20 is attached to first plate 10. Second plate 20 may be attached to a back surface of an object to be mounted on the supporting structure, such as a picture frame and/or a display apparatus, with fasteners, screws, glue, tapes, or other types of bonding tools or fastening members or agents known in the art. Alternatively, second plate may be integrally formed with or manufactured as part of the back surface of the object to be mounted, e.g., a picture frame and/or a display apparatus. The following description uses a picture frame and/or a display apparatus as the exemplary object to be mounted on the supporting structure for explanatory purposes.

First plate 10 includes first magnets 15 and protrusion 12, which projects outwardly from the outer surface of first plate 10, and may be formed in a variety of shapes that fit into the recess described below. First magnets 15 may be disposed alternately in groups having opposite polarities. Referring to FIG. 2, first group 15a of first magnets 15 and second group 15b of first magnets 15 are disposed alternately. First group 15a of first magnets 15 may have a polarity described as "north" pole, and second group 15b of first magnets 15 may have a polarity described as "south" pole. First magnets 15a and 15b are in a generally circular layout. Of course other regular or irregular shapes may be employed depending upon the design of the object to be mounted.

Second plate 20 includes second magnets 25 and an inset or recess such as a groove 22. Second magnets 25 may be disposed alternately in groups having opposite polarities to match the polarity of corresponding first magnets 15. Referring to FIG. 3, first group 25a of second magnets 25 and second group 25b of second magnets 25 are disposed alternately. First group 25a of second magnets 25 may have a polarity described as "north" pole, and second group 25b of second magnets 25 may have a polarity described as "south" pole. Second plate 20 may be attached to first plate 10 by magnetic attraction between first magnets 15 and corresponding second magnets 25. Second plate may comprise a ferromagnetic material such as iron, nickel, cobalt, or other types of ferromagnetic materials known in the art.

Referring to FIG. 1, groove 22 in second plate 20 is formed to snugly receive protrusion 12 of first plate 10 for connection and/or alignment purposes. The horizontal area of the combination of groove 22 and protrusion 12 can resist against vertical forces such as gravity, thereby preventing second plate 20 from falling to the ground. The combination of groove 22 and protrusion 12 may also reduce the needed magnetic attraction for mounting a picture frame and/or a display apparatus onto supporting structure 100. Groove 22 may have a depth less than about 1 mm to avoid making mounting device 200 thick.

In an exemplary embodiment, at least one of first magnets 15 and second magnets 25 may be an electromagnet. Referring to FIGS. 2 and 3, one of first magnets 15 is electromagnet 35 and no magnet is disposed in an area of second plate 20 corresponding to electromagnet 35, however the inventive concepts are not limited thereto. Second magnet 25 corresponding to electromagnet 35 may be disposed in an area of second plate 20 corresponding to electromagnet 35 and may have a polarity opposite to electromagnet 35 to create a strong magnetic attraction. Second plate 20 may comprise a ferromagnetic material such as iron, nickel, cobalt, or other types of ferromagnetic materials known in the art. Second plate 20 may be attached to first plate 10 firmly by the magnetic attraction forces between electromagnet 35 and second plate 20, in addition to the magnetic attraction forces between first magnets 15 and corresponding second magnets 25.

Electromagnet 35 may be an electropermanent magnet known in the art that is operable to generate a magnetic force having a polarity opposite to the magnetic force produced by the electropermanent magnet caused by current moving through one or more electrical coil windings. When attaching, detaching, moving, rotating or adjusting a picture frame and/or a display apparatus, power may be supplied to electromagnet 35 to reduce the magnetic force produced by electromagnet 35. For example, after attaching, detaching, moving, rotating an/or adjusting a picture frame and/or a display apparatus, the power supply may be turned off and the magnetic field generated by electromagnet 35 may be re-produced and maintained to hold a picture frame and/or a display apparatus sturdily. In this manner the amount of attachment force may be variably controlled. The power supply to electromagnet 35 may be separate from any power supply required by the object.

Figure 4:
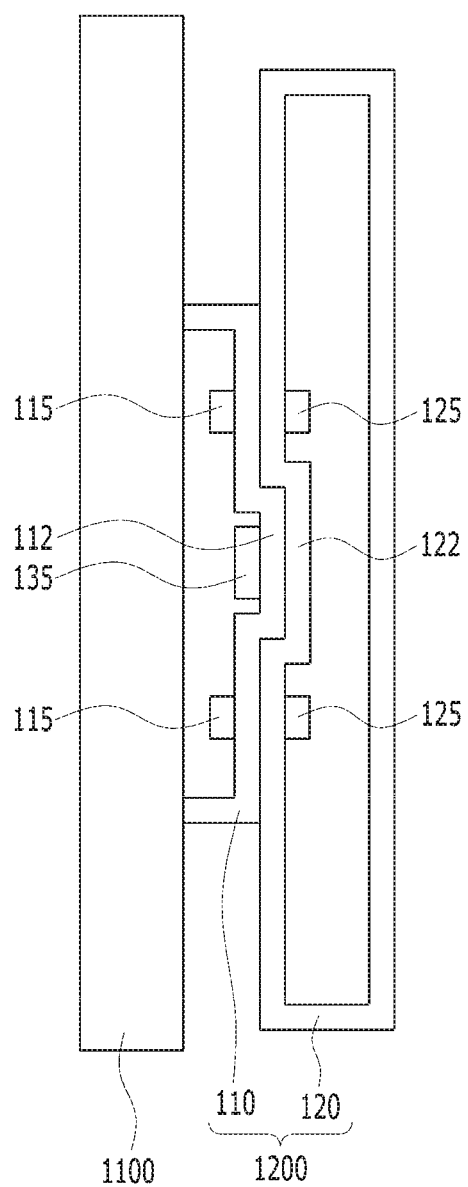
FIG. 4 is a schematic cross sectional view of a mounting device constructed according to another exemplary embodiment of the invention.
Figure 5:
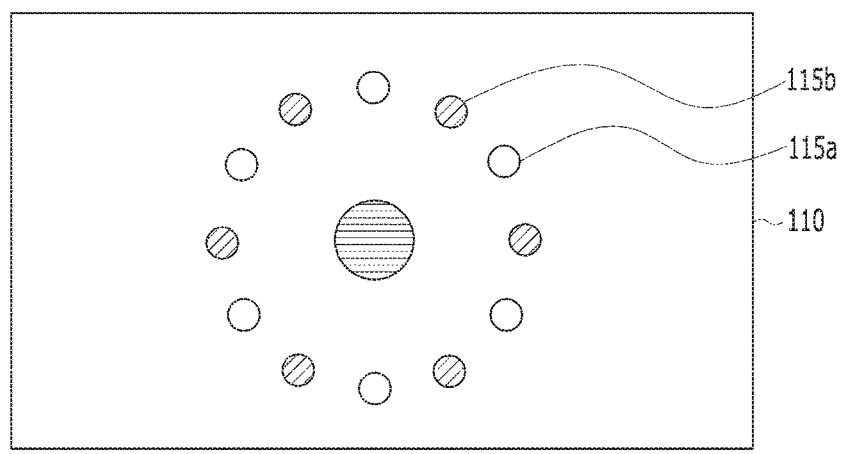
FIG. 5 is a schematic plan view of a first plate of the mounting device of FIG. 4.
Figure 6:
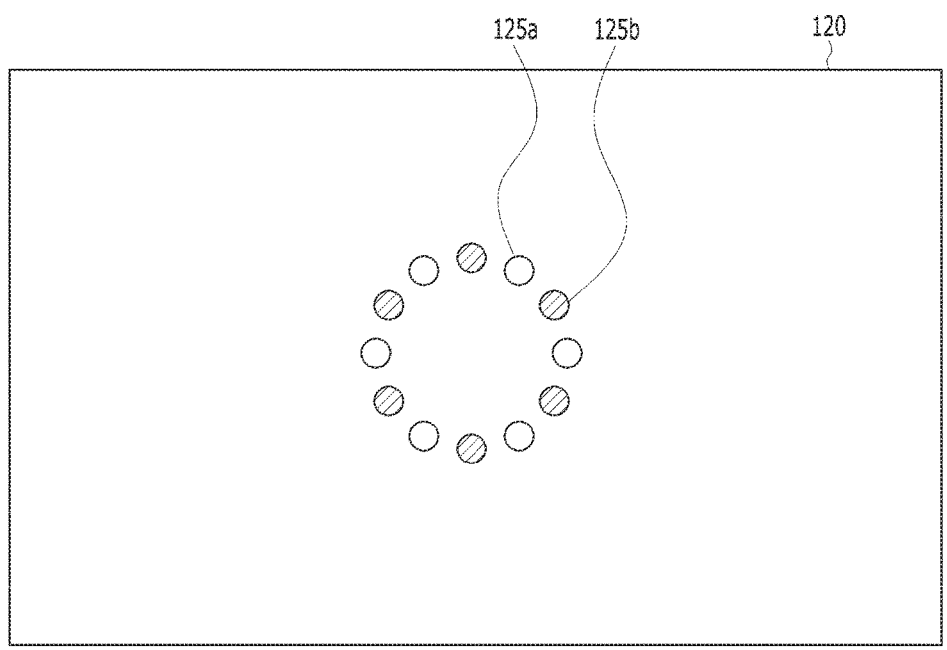
FIG. 6 is a schematic plan view of a second plate of the mounting device of FIG. 4.

FIG. 4 is a schematic cross sectional view of a mounting device constructed according to another exemplary embodiment of the invention. FIG. 5 is a schematic plan view of a first plate of the mounting device of FIG. 4. FIG. 6 is a schematic plan view of a second plate of the mounting device of FIG. 4. Like components to those previously described are designated with like reference numerals and detailed descriptions thereof are omitted to avoid redundancy.

Referring to FIGS. 4 to 6, mounting device 1200 includes first plate 110 and second plate 120. First plate 110 is attached to supporting structure 1100, which may be any type of structure capable of supporting an object, such as interior or exterior load or non-load bearing walls, and the like. First plate 110 may be attached to supporting structure 1100 with fasteners, screws, glue, tapes, or other types of bonding tools or fastening members or agents known in the art. Second plate 120 is attached to first plate 110. Second plate 120 may be attached to a back surface of an object to be mounted on the supporting structure, such as a picture frame and/or a display apparatus, with fasteners, screws, glue, tapes, or other types of bonding tools or fastening members or agents known in the art. Alternatively, second plate may be integrally formed with or manufactured as part of the back surface of the object to be mounted, e.g., a picture frame and/or a display apparatus. The following description uses a picture frame and/or a display apparatus as the exemplary object to be mounted on the supporting structure for explanatory purposes.

First plate 110 includes first magnets 115, electromagnet 135, and protrusion 112. First magnets 115 may be disposed alternately in groups with opposite polarities. Referring to FIG. 5, first group 115a of first magnets 115 and second group 115b of first magnets 115 are disposed alternately. First group 115a of first magnets 115 may have a polarity described as "north" pole, and second group 115b of first magnets 115 may have a polarity described as "south" pole.

Second plate 120 includes second magnets 125 and groove 122. Second magnets 125 may be disposed alternately in groups with opposite polarities to match to corresponding first magnets 115. Referring to FIG. 6, first group 125a of second magnets 125 and second group 125b of second magnets 125 are disposed alternately. First group 125a of second magnets 125 may have a polarity described as "north" pole, and second group 125b of second magnets 125 may have a polarity described as "south" pole. Second plate 120 may be attached to first plate 110 by magnetic attraction between first magnets 115 and corresponding second magnets 125.

Referring to FIG. 4, groove 122 receives protrusion 112. The horizontal area of combination of groove 122 and protrusion 112 can resist against vertical force such as gravity, thereby preventing second plate 120 from falling to the ground. The combination of groove 122 and protrusion 112 may also reduce the amount of magnetic forces needed for mounting a picture frame and/or a display apparatus onto supporting structure 1100.

In an exemplary embodiment, at least one of first magnets 115 and second magnets 125 may be an electromagnet. Referring to FIGS. 2 and 3, one of first magnets 115 is electromagnet 135 and no magnet is disposed in an area of second plate 120 corresponding to electromagnet 135, however the inventive concepts are not limited thereto. Second magnet 125 corresponding to electromagnet 135 may be disposed in an area of second plate 120 corresponding to electromagnet 135 and may have a polarity opposite to electromagnet 135 to create a strong magnetic attraction. Second plate 120 may comprise a ferromagnetic material such as iron, nickel, cobalt, or other types of ferromagnetic materials known in the art. Second plate 120 may be attached to first plate 110 firmly by the magnetic attraction forces between electromagnet 135 and second plate 120, in addition to the magnetic attraction forces between first magnets 115 and corresponding second magnets 125.

Electromagnet 135 may be an electropermanent magnet that is operable to generate a magnetic force having a polarity opposite to the magnetic force produced by the electropermanent magnet caused by current moving through one or more electrical coil windings. When attaching, detaching, moving, rotating or adjusting a picture frame and/or a display apparatus, power may be supplied to electromagnet 135 to reduce the magnetic force produced by electromagnet 135. For example, after attaching, detaching, moving, rotating an/or adjusting a picture frame and/or a display apparatus, the power supply may be turned off and the magnetic field generated by electromagnet 135 may be re-produced and maintained to hold a picture frame and/or a display apparatus sturdily. In this manner the amount of attachment force may be variably controlled. The power supply to electromagnet 135 may be separate from any power supply required by the object.

Figure 7:
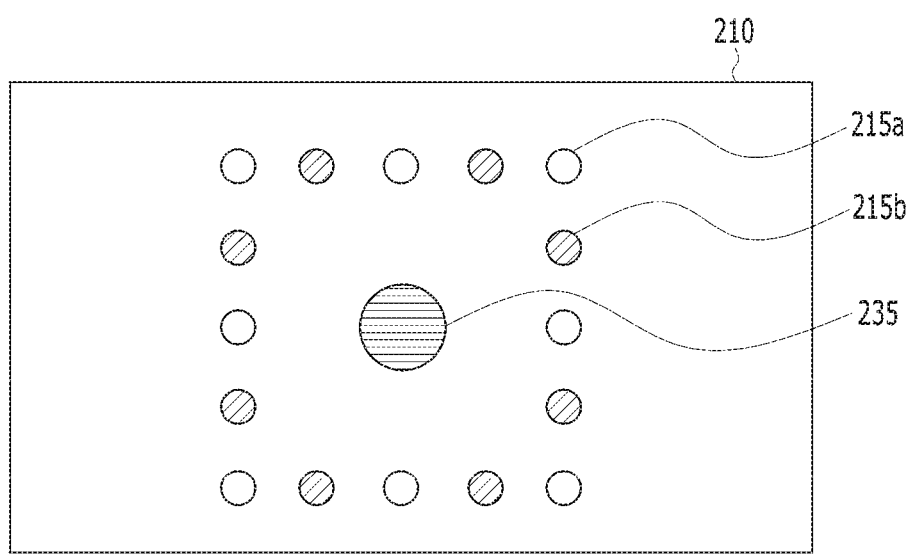
FIGS. 7 to 9 are schematic plan views of first plates of mounting devices constructed according to other exemplary embodiments of the invention.
Figure 8:
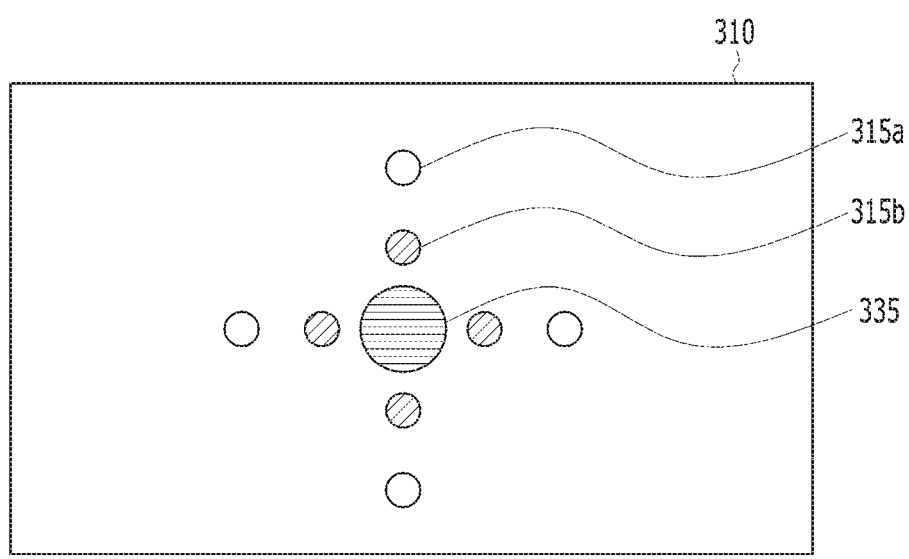
Figure 9:
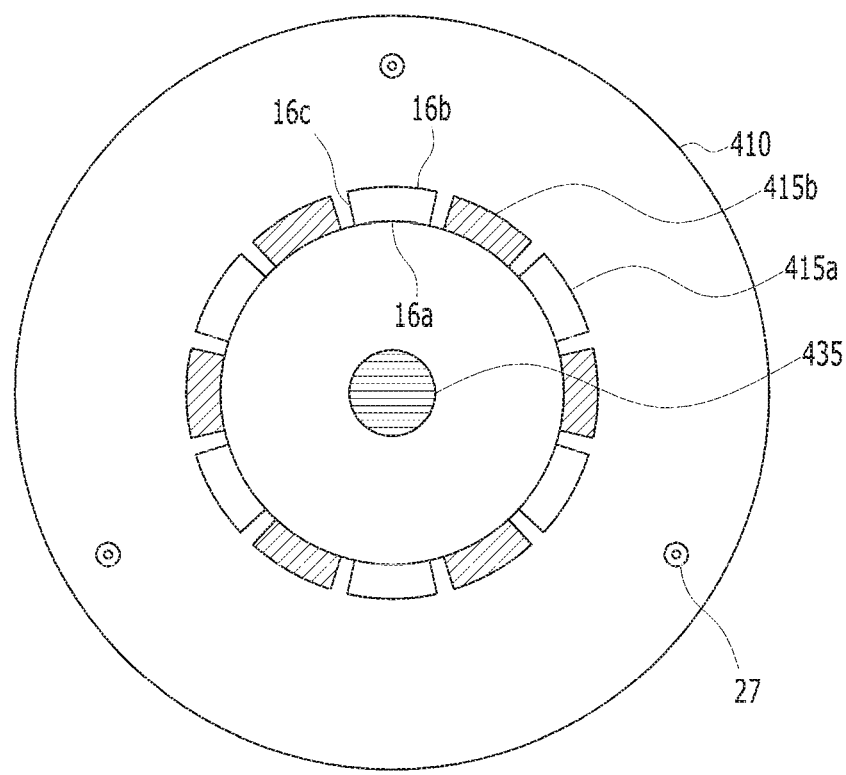

FIGS. 7 to 9 are schematic plan views of first plates of mounting devices constructed according to other exemplary embodiments of the invention.

Referring to FIG. 7, first plate 210 includes first group 215a of first magnets, second group 215b of first magnets, and electromagnet 235. First magnets 215a and 215b are in a generally rectangular layout, such as a square shape. Of course other regular or irregular shapes may be employed depending upon the design of the object to be mounted. First group 215a of first magnets and second group 215b of first magnets are disposed alternately. First group 215a of first magnets may have a polarity described as "north" pole, and second group 215b of first magnets may have a polarity described as "south" pole. Electromagnet 235 is disposed at the space inside of first magnets 215a and 215b. As described with reference to FIGS. 1 to 6, second plate may include second magnets disposed alternately with opposite polarities to match to corresponding first magnets 215a and 215b.

Referring to FIG. 8, first plate 310 includes first group 315a of first magnets, second group 315b of first magnets, and electromagnet 335. First magnets 315a and 315b are in a generally cross-shaped layout. Of course other regular or irregular layout shapes may be employed depending upon the design of the object to be mounted. First group 315a of first magnets and second group 315b of first magnets are disposed alternately. First group 315a of first magnets may have a polarity described as "north" pole, and second group 315b of first magnets may have a polarity described as "south" pole. Electromagnet 335 is disposed in the center of first magnets 315a and 315b. As described with reference to FIGS. 1 to 6, second plate may include second magnets disposed alternately with opposite polarities to match to corresponding first magnets 315a and 315b.

Referring to FIG. 9, first plate 410 has a circular shape, however the inventive concepts are not limited thereto. As shown in FIGS. 7 and 8, first plate 410 may have a rectangular shape and may have other regular or irregular shapes may be employed depending upon the design of the object to be mounted. First plate 410 is attached to a supporting structure with screws 27, however the inventive concepts are not limited thereto. First plate 410 may be attached to the supporting structure with fasteners, screws, glue, tapes, or other types of bonding tools or fastening members or agents known in the art.

First plate 410 includes first group 415a of first magnets, second group 415b of first magnets, and electromagnet 435. First group 415a of first magnets and second group 415b of first magnets are disposed alternately and spaced from each other around to form the circumference of a circle. First group 415a of first magnets may have a polarity described as "north" pole, and second group 415b of first magnets may have a polarity described as "south" pole. Electromagnet 435 is disposed in the center of the circle formed by the first magnets 415a and 415b. As described with reference to FIGS. 1 to 6, second plate may include second magnets disposed alternately with opposite polarities to match to corresponding first magnets 415a and 415b. Each of first magnets 415a and 415b may have curved inner and outer surfaces 16a and 16b and substantially straight side surfaces 16c, each of which is disposed along a radius emanating from the center of circle formed by the first magnets to create a magnet having a fan-type shape. Fan-type shaped magnets can improve adjustment of a picture frame and/or a display device in the direction of rotation and may prevent accidental detaching of the picture frame and/or the display device by hitting the corner of the picture frame and/or the display device.

Figure 10:
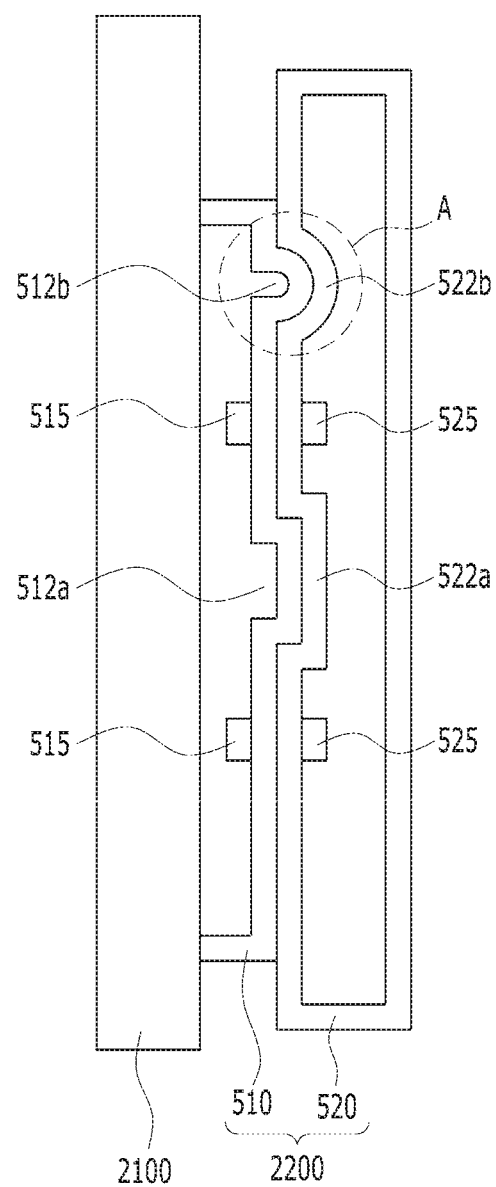
FIG. 10 is a schematic cross sectional view of a mounting device constructed according to yet another exemplary embodiment of the invention.
Figure 11:
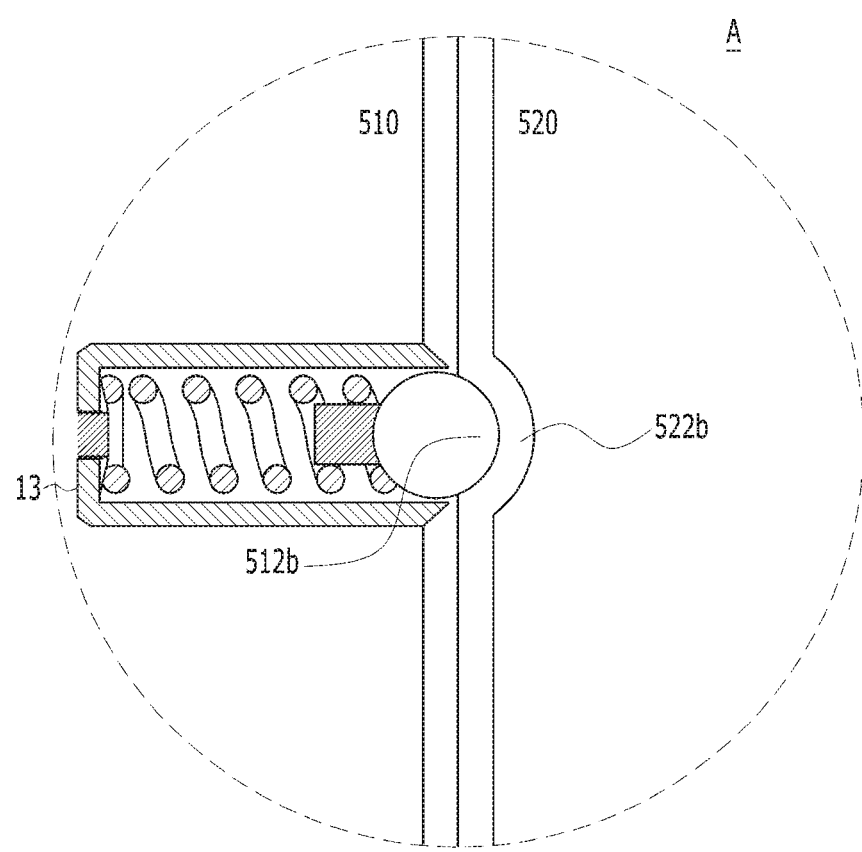
FIG. 11 is a schematic enlarged cross sectional view of area A of the mounting device of FIG. 10.

FIG. 10 is a schematic cross sectional view of a mounting device constructed according to yet another exemplary embodiment of the invention. FIG. 11 is a schematic enlarged cross sectional view of area A of the mounting device of FIG. 10. Hereinafter, the descriptions to the same or substantially the same components as in the embodiments of FIGS. 1 to 6 will be omitted to avoid redundancy.

First plate 510 includes first magnets 515 and protrusions 512a and 512b. Second plate 520 includes second magnets 525 and grooves 522a and 522b. Grooves 522a and 522b receive protrusions 512a and 512b, respectively. As described with reference to FIGS. 1 to 6, the horizontal area of combination of groove 522a and protrusion 512a can resist against vertical force such as gravity, thereby preventing second plate 520 from falling to the ground. The combination of groove 522a and protrusion 512a may also reduce the amount of magnetic forces needed for mounting a picture frame and/or a display apparatus onto supporting structure 2100. Referring to FIG. 11, ball spring 13 may mounted in protrusion 512b. The combination of ball spring 13 in protrusion 512b and groove 522b forms a detent mechanism that can improve accuracy of alignment of a picture frame and/or a display apparatus.

Figure 12:
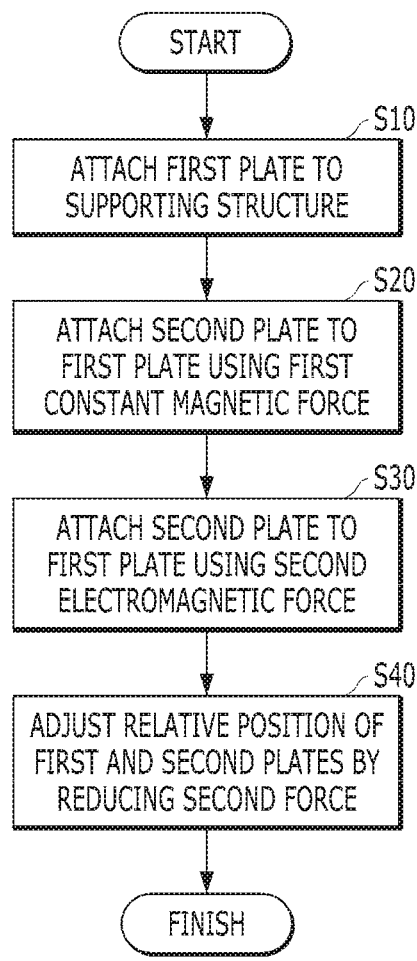
FIG. 12 is a flow chart of an exemplary method of mounting an electronic display to a supporting structure according to the principles of the invention.

FIG. 12 is a flow chart of an exemplary method of mounting an electronic display to a supporting structure according to the principles of the invention.

Referring to FIG. 12, to mount an electronic display to a supporting structure according to an exemplary embodiment, a first plate is attached to a supporting structure at step S10, and a second plate is attached to the first plate using a first magnetic force at step S20. The order of the first and second steps may be reversed, of course. The second plate may be attached to an electronic display or may be formed as part of an electronic display. The first magnetic force may be a substantially constant magnetic force.

The second plate is attached to the first plate using a second, variable magnetic force to increase the force holding the first and second plates together at step S30. The second magnetic force may be an electromagnetic force produced by an electromagnet. The electromagnet may be coupled between the first and second plate, and the power supply for the electromagnet may be turned off to increase the force holding the first and second plates together. At optional step S40, the relative position of the first and second plates may be adjusted by reducing the second force, e.g., the power supply of the electromagnet may be turned on to decrease the electromagnetic force and therefore decrease the total forces holding the first and second plates together.

According to the above description, the electromagnet may be disposed on at least one of the first plate or the second plate in addition to the permanent magnets, and thus magnetic forces and corresponding attraction between the first plate and the second plate can be variably controlled. A picture frame and/or a display apparatus can be easily attached, detached, moved, rotated or adjusted by using the electromagnet.

The use of a fan-type shaped magnet can improve the adjustment of a picture frame and/or a display device in the direction of rotation, may prevent accidental detaching of the picture frame and/or the display device by hitting the corner of the picture frame and/or the display device. A detent mechanism, such as the combination of a ball spring and protrusion and groove can improve accuracy of alignment of a picture frame and/or a display apparatus.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A mounting device for attaching an object to a supporting structure, the mounting device comprising:
   a first member including at least one first magnet and a projection, the first member configured to be attached to the supporting structure;
   a second member including at least one second magnet and a recess to receive the projection, the at least one second magnet configured to be attracted to the at least one first magnet; and an electromagnet selectively operable to provide magnetic force to couple the first and second members together;

wherein the electromagnet has a power supply operable to reduce the magnetic force produced by the electromagnet while power is supplied to the electromagnet.

2. The device of claim 1, wherein:

the at least one first magnet comprises a plurality of first magnets disposed alternately with opposite polarities, and the at least one second magnet comprises a plurality of second magnets disposed alternately with opposite polarities to match to the corresponding at least one first magnet.

3. The device of claim 1, wherein the electromagnet is an electropermanent magnet.

4. The device of claim 1, the at least one first magnet comprises a plurality of magnets arranged in at least one of a substantially circular layout, a substantially rectangular square layout, and a substantially cross-shaped layout.

5. The device of claim 1, wherein the projection and the recess comprise part of a detent mechanism including a spring biasing the projection into the recess.

6. The device of claim 1, wherein at least one of each of the first magnets and the second magnets has curved inner and outer surfaces disposed along a radius emanating from a center of circle formed by the first magnets.

7. The device of claim 1, wherein the recess comprises a groove having a depth less than about 1 mm.

8. The device of claim 1, wherein the object comprises one of an electronic display and a picture frame and the supporting structure comprises at least part of a wall.

9. The device of claim 1, wherein at least one of the first and second members comprises a plate.

10. The device of claim 1, wherein the second member comprises a portion of the object to be attached to the supporting structure.

11. The device of claim 10, wherein the object comprises an electronic display and the electromagnet has the power supply separate from the electronic display.

12. A mounting device comprising:

a first member comprising magnets and a protrusion, the first member configured to be attached to a supporting structure; and a second member comprising a portion of an electronic display to be attached to the supporting structure, the second member having a groove to receive the protrusion, wherein at least one of the magnets is an electromagnet having a power supply separate from the electronic display.

13. The device of claim 12, wherein the electromagnet is an electropermanent magnet.

14. The device of claim 12, wherein the protrusion and the groove comprise part of a detent mechanism including a spring biasing the protrusion into the groove.

15. The device of claim 12, wherein the groove has a depth less than about 1 mm.

16. The device of claim 12, wherein at least one of the first and second members comprises a plate.

* * * * *